(12) United States Patent
Shono et al.

(10) Patent No.: US 11,959,169 B2
(45) Date of Patent: *Apr. 16, 2024

(54) ASYMMETRIC INJECTION FOR BETTER WAFER UNIFORMITY

(71) Applicant: Applied Materials, Inc., Santa Clara, CA (US)

(72) Inventors: Eric Kihara Shono, San Mateo, CA (US); Vishwas Kumar Pandey, Madhya Pradesh (IN); Christopher S. Olsen, Fremont, CA (US); Kartik Shah, Saratoga, CA (US); Hansel Lo, San Jose, CA (US); Tobin Kaufman-Osborn, Sunnyvale, CA (US); Rene George, San Carlos, CA (US); Lara Hawrylchak, Gilroy, CA (US); Erika Hansen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/958,282

(22) Filed: Sep. 30, 2022

(65) Prior Publication Data

US 2023/0028054 A1 Jan. 26, 2023

Related U.S. Application Data

(63) Continuation of application No. 16/776,204, filed on Jan. 29, 2020, now Pat. No. 11,486,038.

(Continued)

(51) Int. Cl.
*C23C 16/455* (2006.01)
*C23C 16/40* (2006.01)
(Continued)

(52) U.S. Cl.
CPC ........ *C23C 16/45517* (2013.01); *C23C 16/40* (2013.01); *C23C 16/45563* (2013.01);
(Continued)

(58) Field of Classification Search
CPC .............. C23C 16/45517; C23C 16/40; C23C 16/45563; C23C 16/45582;
(Continued)

(56) References Cited

U.S. PATENT DOCUMENTS

| 6,291,800 B1 | 9/2001 | Shirakawa et al. |
| 11,486,038 B2 * | 11/2022 | Shono ............... C23C 16/45502 |

(Continued)

FOREIGN PATENT DOCUMENTS

| CN | 107403714 A | 11/2017 |
| CN | 107690487 A | 2/2018 |

(Continued)

OTHER PUBLICATIONS

International Search Report dated May 27, 2020 for Application No. PCT/US2020/015801.

(Continued)

*Primary Examiner* — Jeffrie R Lund
(74) *Attorney, Agent, or Firm* — Patterson + Sheridan, LLP

(57) ABSTRACT

A gas injector for processing a substrate includes a body having an inlet connectable to a gas source that is configured to provide a gas flow in a first direction into the inlet when processing a substrate on a substrate support disposed within a processing volume of a processing chamber, and an a gas injection channel formed in the body. The gas injection channel is in fluid communication with the inlet and configured to deliver the gas flow to an inlet of the processing chamber. The gas injection channel has a first interior surface and a second interior surface that are parallel to a (Continued)

second direction and a third direction. The second and third directions are misaligned with a center of the substrate, and are at an angle to the first direction towards a first edge of the substrate support.

10 Claims, 7 Drawing Sheets

Related U.S. Application Data

(60) Provisional application No. 62/897,900, filed on Sep. 9, 2019, provisional application No. 62/798,474, filed on Jan. 30, 2019.

(51) Int. Cl.
  *C23C 16/458* (2006.01)
  *C23C 16/52* (2006.01)
  *H01L 21/67* (2006.01)

(52) U.S. Cl.
  CPC .. *C23C 16/45582* (2013.01); *C23C 16/45587* (2013.01); *C23C 16/45591* (2013.01); *C23C 16/4584* (2013.01); *C23C 16/52* (2013.01); *H01L 21/67017* (2013.01)

(58) Field of Classification Search
  CPC ........ C23C 16/45587; C23C 16/45591; C23C 16/4584; C23C 16/52; C23C 8/10; C23C 8/12; C23C 16/45502; C23C 16/46; H01L 21/67017; H01L 21/67115; H01L 21/6719; H01L 21/0223; H01L 21/68764
  See application file for complete search history.

(56) References Cited

U.S. PATENT DOCUMENTS

| | | | |
|---|---|---|---|
| 11,634,813 B2* | 4/2023 | Shono | C23C 16/45502 |
| | | | 118/724 |
| 2002/0185062 A1 | 12/2002 | Halpin | |
| 2003/0150560 A1 | 8/2003 | Kinnard et al. | |
| 2003/0178145 A1 | 9/2003 | Anderson et al. | |
| 2004/0241992 A1 | 12/2004 | Kono et al. | |
| 2005/0221618 A1* | 10/2005 | AmRhein | C23C 16/452 |
| | | | 156/345.29 |
| 2006/0249695 A1 | 11/2006 | Choi | |
| 2007/0107653 A1 | 5/2007 | Yamada | |
| 2007/0281084 A1 | 12/2007 | Hirosawa et al. | |
| 2008/0178801 A1 | 7/2008 | Pavloff et al. | |
| 2009/0214798 A1 | 8/2009 | Yousif et al. | |
| 2011/0174212 A1 | 7/2011 | Ramachandran et al. | |
| 2012/0085278 A1 | 4/2012 | Moslehi et al. | |
| 2012/0266819 A1 | 10/2012 | Sanchez et al. | |
| 2014/0190822 A1 | 7/2014 | Riker et al. | |
| 2014/0322897 A1 | 10/2014 | Samir et al. | |
| 2015/0099065 A1* | 4/2015 | Canizares | C30B 25/14 |
| | | | 427/255.28 |
| 2016/0189951 A1 | 6/2016 | Lee et al. | |
| 2016/0293431 A1* | 10/2016 | Sriraman | C23C 16/45561 |
| 2016/0362813 A1* | 12/2016 | Bao | H01J 37/3244 |
| 2017/0287753 A1* | 10/2017 | Musselman | H01L 21/68742 |
| 2017/0314126 A1 | 11/2017 | Tjandra et al. | |
| 2018/0223426 A1 | 8/2018 | Shono | |
| 2020/0071832 A1* | 3/2020 | Lau | C23C 16/45572 |
| 2020/0240014 A1* | 7/2020 | Shono | H01L 21/67017 |
| 2022/0081767 A1* | 3/2022 | Shono | C23C 16/45563 |
| 2022/0165547 A1* | 5/2022 | Pandey | C23C 16/45548 |
| 2023/0028054 A1* | 1/2023 | Shono | H01L 21/67115 |

FOREIGN PATENT DOCUMENTS

| | | |
|---|---|---|
| JP | S61253822 A | 11/1986 |
| JP | H11-176811 A | 7/1999 |
| JP | 2002198316 A | 7/2002 |
| JP | 2005259902 A | 9/2005 |
| JP | 2009239082 A | 10/2009 |
| JP | 201254310 A | 3/2012 |
| JP | 2016035087 A | 3/2016 |
| JP | 2018-157196 A | 10/2018 |
| KR | 10-2017-0006175 A | 1/2017 |
| KR | 10-2017-0123256 A | 11/2017 |
| KR | 10-2018-0091760 A | 8/2018 |
| TW | 200808985 A | 2/2008 |
| TW | I457997 B | 10/2014 |
| TW | I591199 B | 7/2017 |
| TW | M569933 U | 11/2018 |

OTHER PUBLICATIONS

Japanese Office Action dated Sep. 27, 2022 for application No. 2021-543200.
KR Office Action dated Jan. 30, 2023 for Application No. 10-2021-7027676 (with translation).
TW Office Action dated Aug. 21, 2023 for Application No. 109102773.
Chinese Office Action dated Nov. 29, 2023 for Application No. 202080062904.0.
Japanese Office Action dated Apr. 18, 2023 for Application No. 2022-514991.

* cited by examiner

ASYMMETRIC INJECTION FOR BETTER WAFER UNIFORMITY

CROSS-REFERENCE TO RELATED APPLICATIONS

This application is a continuation application of U.S. Non-provisional patent application Ser. No. 16/776,204, filed on Jan. 29, 2020, which claims the benefit to U.S. Provisional Application Nos. 62/798,474, filed Jan. 30, 2019, and 62/897,900, filed Sep. 9, 2019. Each of the aforementioned patent applications are incorporated herein by reference in their entireties.

BACKGROUND

Field

The present disclosure relates generally to a semiconductor processing apparatus and processing method, more specifically, to a reactor with an improved gas flow distribution.

Description of the Related Art

In fabrication of memory gate oxides, liner oxides, sacrificial oxides, sidewall oxides, flash tunnel oxides, oxide-nitride-oxide (ONO) stacks, or the like in integrated circuits and micro-devices, semiconductor substrates may be processed by rapid thermal oxidation. In this process, an oxide layer may be formed on a substrate by exposing the substrate to oxygen and hydrogen based reactant gas while heating the substrate with a radiant heat source to produce oxygen and hydrogen radicals. Oxygen radicals strike the surface of the substrate to form an oxide layer, for example a silicon dioxide layer on a silicon substrate.

In existing processing chambers used for rapid thermal oxidation, gas injection mechanisms distribute reactant gas non-uniformly over the substrate, resulting in poor thickness uniformity in an oxide layer on the substrate. Conventionally, a rotatable substrate support rotates a substrate while a reactant gas is introduced straight towards the center of the substrate. The reactant gas is distributed more at the center of the substrate and less near edges of the substrate, and thus thickness of an oxide layer grown near the edges of the substrate is less than at or near the center of the substrate.

Therefore, there is a need for an improved injection mechanism that distributes reactant gas more uniformly over the substrate.

SUMMARY

Implementations of the present disclosure provide apparatus for improving gas distribution during thermal processing. One implementation of the present disclosure provides an apparatus for thermal processing a substrate. The apparatus includes a body, an angled projection, and a gas injection channel. The gas injection channel has a first half-angle and a second half-angle. The first half-angle is different from the second half-angle.

Another implementation of the present disclosure provides an apparatus for processing a substrate comprising a chamber body defining a processing volume and a substrate support disposed in the processing volume. The substrate support has a substrate supporting surface. The apparatus also includes a gas source projection coupled to an inlet of the chamber body, an exhaust assembly coupled to an outlet of the chamber body, and a side gas assembly coupled to a sidewall of the chamber body. The side gas assembly includes a gas injection channel. The gas injection inlet includes a first half-angle and a second half-angle. The first half-angle is different from the second half-angle.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements disclosed in some embodiments may be beneficially utilized on other implementations without specific recitation.

DETAILED DESCRIPTION

Figure 1A:
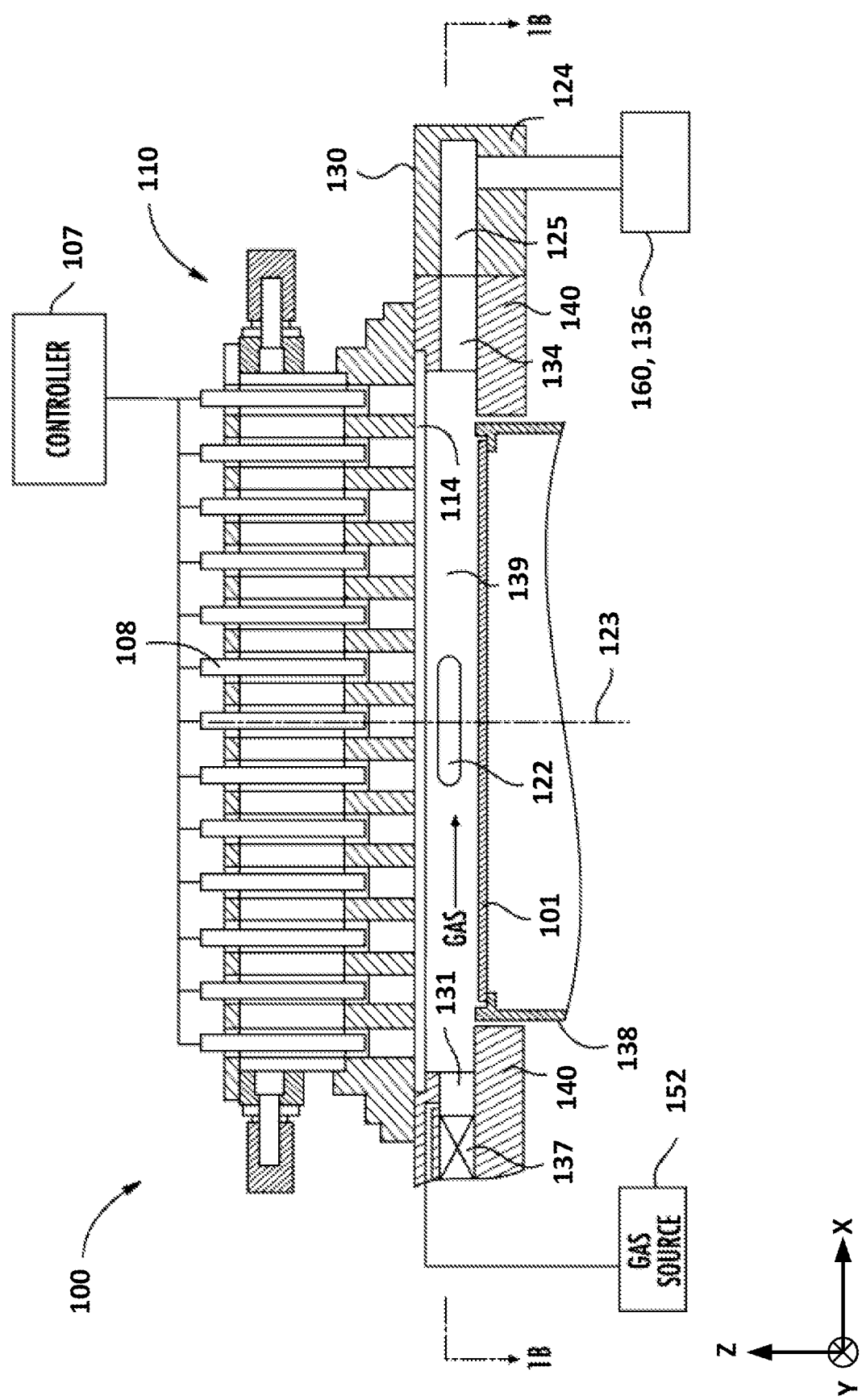
FIG. 1A is a schematic cross-sectional view of a processing chamber according to one embodiment.

Embodiments described herein generally related to a semiconductor processing apparatus and processing method, and, more specifically, to a reactor with an improved gas flow distribution. Embodiments of the disclosure provide an asymmetric gas injector that includes a gas injection channel that is configured to inject a gas towards an edge of a substrate disposed in a process chamber, thereby increasing a reaction with the gas at or near the edge of the substrate. Embodiments of the disclosure further provide a side pump that is configured to redirect the gas towards an opposing edge of the substrate, thereby increasing a reaction across the substrate surface and the opposing edge of the substrate. Thus, a layer formed over the substrate by the injected gas is uniform across the substrate surface.

In the following description, an orthogonal coordinate system including an X axis, a Y axis, and a Z axis is used. The directions represented by the arrows in the drawing are assumed to be positive directions for convenience.

FIG. 1A is a schematic cross-sectional view of a processing chamber 100 according to one embodiment. The processing chamber 100 generally includes a lamp assembly 110, a chamber body 130 defining a processing volume 139. A substrate support 138 disposed in the processing volume 139 in a X-Y plane. The processing chamber 100 provides a controlled thermal cycle that heats a substrate 101 to perform one or more thermal processes on the substrate 101, such as thermal annealing, thermal cleaning, thermal chemical vapor deposition, thermal oxidation and thermal nitridation.

The lamp assembly 110 may be positioned relatively above the substrate support 138 in the Z direction to supply heat to the processing volume 139 via a quartz window 114. The quartz window 114 is disposed between the substrate 101 and the lamp assembly 110 in the Z direction. The lamp assembly 110 may additionally or alternatively be disposed below the substrate support 138 in the Z direction in some embodiments. The lamp assembly 110 houses a heating source 108, such as tungsten-halogen lamps for providing an infrared heating means to a substrate 101 disposed on the substrate support 138. The tungsten-halogen lamps may be disposed in a hexagonal arrangement. The heating source 108 may be controlled by a controller 107 to achieve a uniform or tailored heating profile to the substrate 101. In some embodiments, the heating source 108 can rapidly heat the substrate 101 at a rate of from about 5° C./s to about 280° C./s.

The substrate 101 may be heated to a temperature ranging from about 450° C. to about 1100° C. The heating source 108 may provide temperature tuning of the substrate 101 at certain locations while not affecting temperatures at other locations. A slit valve 137 may be disposed on a base ring 140 for a robot to transfer the substrate 101 into and out of the processing volume 139. The substrate 101 may be placed on the substrate support 138. The substrate support 138 may move vertically in the Z direction and rotate in the X-Y plane about a central axis 123. A gas inlet (also referred to as a chamber gas inlet) 131 may be disposed over the base ring 140 in the Z direction and connected to a gas source 152.

Figure 1B:
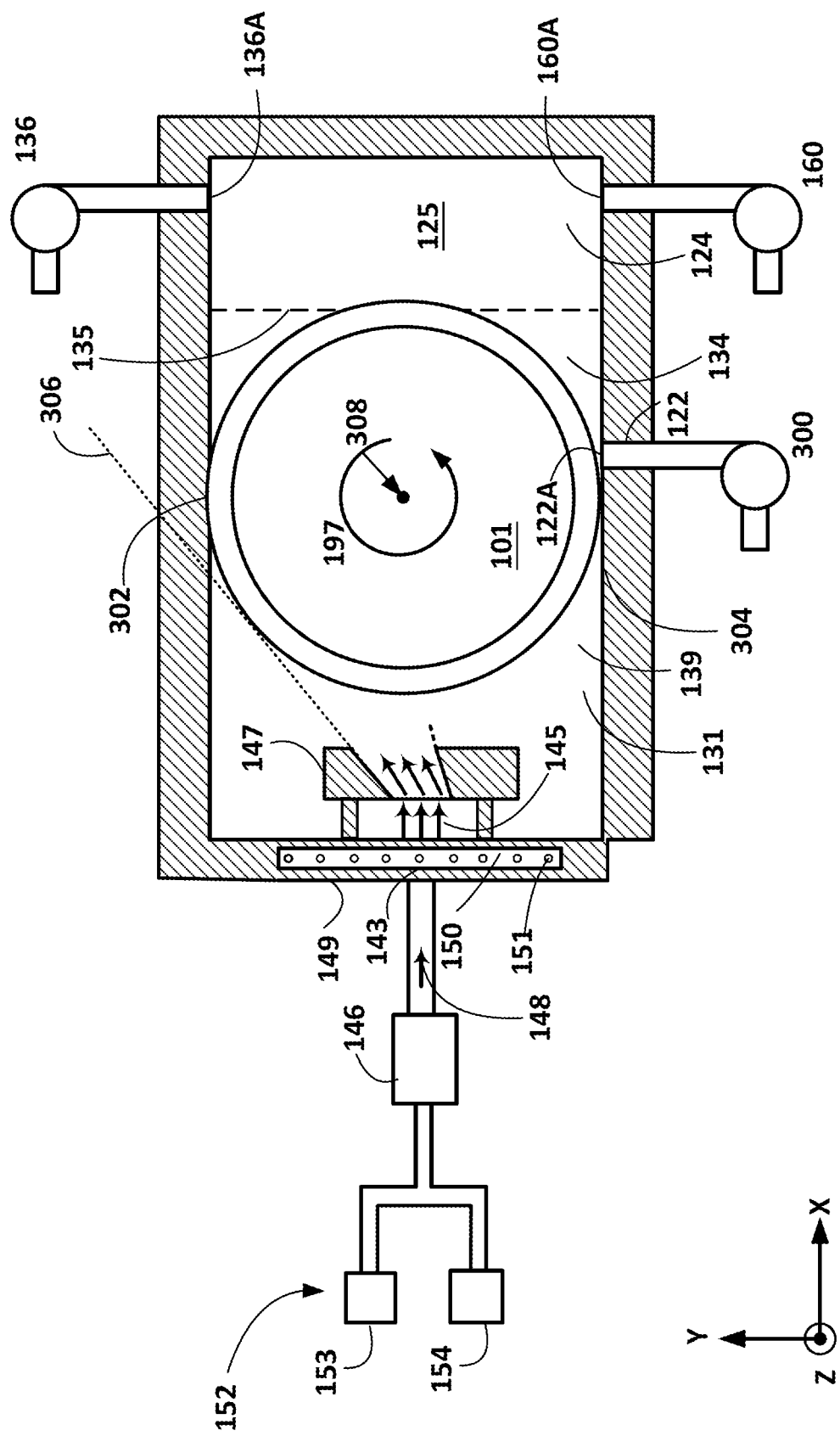
FIG. 1B is a schematic cross-sectional top view of a processing chamber according to one embodiment.

FIG. 1B is a schematic cross-sectional top view of the processing chamber 100. As shown in FIG. 1B, the gas inlet 131 and a gas outlet (also referred to as a chamber gas outlet) 134 are disposed on opposite sides of the processing volume 139 in the X direction. The gas inlet 131 and the gas outlet 134 may have a linear or azimuthal width which approximately equals a diameter of the substrate support 138.

Referring to both FIGS. 1A and 1B, the gas outlet 134, formed on an opposite side of the base ring 140 from the gas inlet 131 in the X direction, is an exhaust assembly 124 which is in fluid communication with first and second main exhaust pumps 160, 136 on the sidewalls of the chamber body 130 that have openings 160A and 136A, respectively, that are opposite to each other in the Y direction. The exhaust assembly 124 defines an exhaust volume 125. The exhaust volume 125 is in fluid communication with the processing volume 139 via the gas outlet 134. In some embodiments, the gas outlet 134 may include a perforated plate 135 that includes a series of thru holes that are configured to restrict gas flow therethrough and thus provide a uniform draw of gases from the processing volume 139 (i.e., uniform in the Y-Z plane). However, in other embodiments, the perforated plate 135 is either not used in the processing chamber 100 or is configured to provide a minimal restriction to the flow of gas from the processing volume 139 to the exhaust volume 125, and thus allows the position of the openings 160A and 136A to affect the flow pattern within the processing volume 139 and the exhaust volume 125. In one example, as shown in FIG. 1B, the configuration of the openings 160A and 136A is such that the flow pattern in the exhaust volume 125 and later portion of the processing volume 139 is higher at the left extent of the processing volume 139 (i.e., near a second edge 302) due to the position of opening 136A and higher at the right extent of the processing volume 139 (i.e., near a first edge 304) due to the position of opening 160A, and thus has a proportionally smaller flow in the middle of the exhaust volume 125 and later portion of the processing volume 139. In another example, the second main exhaust pump 136 is turned off and the first main exhaust pump 160 is used to pump gases from the processing volume 139 and exhaust volume 125 via the opening 160A such that the flow pattern in the exhaust volume 125 and later portion of the processing volume 139 is higher at the right extent of the processing chamber due to the position of opening 160A, and thus has an increasing gradient in flow from the left side to the right side of the exhaust volume 125 and later portion of the processing volume 139 (e.g., increasing gradient is in the —Y-direction). In yet another example, the first main exhaust pump 160 is turned off and the second main exhaust pump 136 is used to pump gases from the processing volume 139 and exhaust volume 125 via the opening 136A such that the flow pattern in the exhaust volume 125 and later portion of the processing volume 139 is higher at the left extent of the processing chamber due to the position of opening 136A, and thus has an increasing gradient in flow from the right side to the left side of the exhaust volume 125 and later portion of the processing volume 139 (e.g., increasing gradient is in the +Y-direction).

In some embodiments, a side port 122 may be formed within the base ring 140 on a sidewall of the chamber body 130, on which the first main exhaust pump 160 is located, and near the first edge 304 of the processing volume 139 between the gas inlet 131 and the gas outlet 134 in the X direction (shown in FIG. 1B). The side port 122, the gas inlet 131, and the gas outlet 134 may be disposed at substantially the same level in the Z direction. The side port 122 is in fluid communication with a side exhaust pump 300 (shown in FIG. 1B).

The gas source 152 may comprise one or more gas sources, for example a first gas source 153, and a second gas source 154, each of which provides a processing gas into an injection cartridge 149. In some embodiments, the first gas source 153 is a remote plasma source (RPS) that produces oxygen and hydrogen radicals. For a RadOx® process that heats the substrate 101 with lamps and injects hydrogen and oxygen radicals into the processing volume 139, a gas injector 147 in fluid communication with the gas inlet 131 and the gas source 152 may be connected to the base ring 140. A flow adjusting device 146 may be placed between the gas source 152 and the gas injector 147 to control a flow rate of a gas flow 148. It is believed that the introduction of hydrogen radicals improve the reaction rate along the edge of the substrate 101, while the substrate is rotated, during the performance of an oxidation process, leading to an oxide layer having improved thickness uniformity. The gas flow 148 may include 5 to 80 percent hydrogen gas by volume and 20 to 95 percent oxygen gas by volume and have a flow rate ranging from about 1 slm to about 50 slm. In some embodiments, the gas mixture also has a concentration of argon in the range of about 5% to about 80%, for example, in the range of about 10% to about 50%. For a substrate with a 300 mm diameter, the flow rate ranges from about 0.007 slm/cm$^2$ to about 0.035 slm/cm$^2$. The composition, pressure, and the flow rate of the gas flow 148 affects in thickness uniformity of an oxide layer formed on the substrate 101.

Gas flows through from the gas source 152 optionally through the injection cartridge 149, the gas injector 147, and the gas inlet 131 into the processing volume 139. In some embodiments, the injection cartridge 149 has an elongated channel 150 and an inlet (also referred to as an injector inlet) 143 formed therein. Injecting holes 151 are distributed along the elongated channel 150 and are configured to inject a main gas flow 145 towards the processing volume 139 in a direction that is at an angle to the X direction. In some embodiments of an oxidation process, the main gas flow 145 may include 5 to 80 percent hydrogen gas by volume and 20 to 95 percent oxygen gas by volume, and have a flow rate ranging from about 1 standard liters per minute (slm) to about 50 slm while the chamber is maintained at a pressure of about 1 Torr to about 19 Torr, such as between about 5 Torr to about 15 Torr and the substrate is heated to a temperature of between about 450° C. to about 1100° C. In some embodiments, the gas mixture also has a concentration of argon in the range of about 5% to about 80%, for example, in the range of about 10% to about 50%. The flow rate is based on the substrate 101 having a 300 mm diameter, which leads to a flow rate ranging from about 0.011 slm/cm$^2$ to about 0.071 slm/cm$^2$.

The main gas flow 145 is directed from the gas flow 148 and optionally also from the injecting holes 151 towards the gas outlet 134 in the X direction. The main gas flow 145 flows into the exhaust volume 125 and is exhausted by one or both of the first and second main exhaust pumps 160, 136. It is believed geometry of a processing chamber 100 (such as a location, a shape, a direction of the exhaust volume 125), the size and position of the openings 160A, 136A of the first and second main exhaust pumps 160, 136, and pumping speeds achieved by the first and second main exhaust pumps 160, 136 can be used to affect the gas flow pattern, and thus flow uniformity in the processing volume 139. However, in some alternate embodiments, the exhaust volume 125 of the exhaust assembly 124 extends along the direction of the main gas flow 145 such that the geometry influence of the processing volume 139 on the main gas flow 145 is reduced (e.g., located far enough from the gas inlet 131).

The first and second main exhaust pumps 160, 136 may be also used to control the pressure of the processing volume 139. In one some embodiments, the pressure inside the processing volume 139 is maintained at about 0.5 Torr to about 19 Torr, such as between about 5 Torr to about 15 Torr. In some embodiments, the processes performed in the processing volume 139 operate within the viscous flow regime range. In this case, the first and second main exhaust pumps 160, 136 draw a volume of gas to their respective openings 160A, 136A of the first and second main exhaust pumps 160, 136, push the volume of gas through the pump mechanism, and expel the volume of gas to the pump inlets at atmospheric pressure. As a result, as discussed above, a gradient in the gas concentration (i.e., the gas concentration is lower near the pump inlets and higher away from the pump inlets) is created, causing the gas inside the processing volume 139 to flow towards the pump inlets.

In one example embodiment shown in FIG. 1B, the gas injector 147 is an asymmetric structure with an opening which directs the majority of the main gas flow 145 from the gas inlet 131 towards the second edge 302 of the processing volume 139. Thus, the gas exposure of the substrate 101 is increased at or near the second edge 302 of the processing volume 139. In some embodiments, the main gas flow 145 is exhausted by the first and second main exhaust pumps 160, 136 on the either sides of the chamber body 130. In some embodiments, the main gas flow 145 that is directed towards the second edge 302 of the processing volume 139 is redirected towards the first edge 304 of the processing volume 139 by use of the side exhaust pump 300. The side exhaust pump 300 may create a gradient in the gas concentration (i.e., the gas concentration is lower near a pump inlet of the side exhaust pump 300 and higher away from the pump inlet of the side exhaust pump 300), causing the gas inside the processing volume 139 to flow towards the pump inlet of the side exhaust pump 300.

In some embodiments, the main gas flow 145 that is redirected towards the first edge 304 of the processing volume 139 is exhausted by the side exhaust pump 300 and the first main exhaust pump 160 while the second main exhaust pump 136 is turned off. In some embodiments, the ratio of exhaust flow rates of the side exhaust pump 300 to the first main exhaust pump 160 is between 0.5:1 and 1:0.5. In other embodiments, the side exhaust pump 300, and the first and second main exhaust pumps 160 and 136 are turned on. Thus, in some embodiments, the ratio of exhaust flow rates of the side exhaust pump 300 to the first main exhaust pump 160 plus the second main exhaust pump 136 is between 0.5:1 and 1:0.5.

In some embodiments, the substrate 101 is rotatable in a counter clockwise direction 197, as the gas is directed towards an edge of the substrate 101, thus causing gas to flow over the substrate 101 resulting in more uniform growth across the substrate 101. The rotation of the substrate 101, in an opposing direction to the gas flow, may be used to redirect the main gas flow 145 towards the first edge 304 of the processing volume 139 while the gas injector 147 directs the main gas flow 145 towards the second edge 302 of the processing volume 139. A velocity and a flow pattern of the main gas flow 145 in the processing volume 139 may be adjusted through a rotation speed of the substrate 101 and a tilted angle (referred to as a cone angle θ below) of a gas injection channel of the gas injector 147 such that non-uniformities in the main gas flow 145 over the substrate 101 are reduced. In some embodiments, the rotation speed of the substrate ranges between about 5 and 300 rpm, and the cone angle θ may be between 10° and 35°. As a result, the thickness profile at the edges of the substrate is improved. In some embodiments, the substrate 101 is rotatable in a clockwise direction opposite to the counter clockwise direction 197 to further increase gas velocity along the edge in order to achieve differently desired thickness profile.

When the main gas flow 145 (either gas or gas of radicals) is directed in a direction towards the edge of the substrate 101 near the second edge 302 of the processing volume 139 (or the edge of the substrate supporting surface of the substrate support 138), while the substrate is rotated, the gas or gas of radicals significantly promote the reaction rate along the edge of the substrate 101 near the second edge 302 of the processing volume 139 versus at or near the center 308 of the substrate 101. Directing gas towards the edge of the substrate 101 near the second edge 302 of the processing volume 139 through an asymmetric gas injection channel 249 (shown in FIG. 3A), with or without the side exhaust pump 300, leads to an oxide layer having improved thickness uniformity throughout the substrate 101 over directing gas towards the center 308 of the substrate 101. In one example of an oxidation process, the main gas flow 145 may include 5 to 80 percent hydrogen gas by volume and 20 to 95 percent oxygen gas by volume, optionally a concentration of argon in the range of about 5% to about 80%, a flow rate ranging from about 1 standard liter per minute (slm) to about 50 slm while the chamber is maintained at a pressure of about 0.5 Torr to about 19 Torr, and the substrate is heated to a temperature of between about 450° C. to about 1100° C., and rotated in a counter clockwise direction at a speed between about 10 rpm and 300 rpm.

Figure 2A:
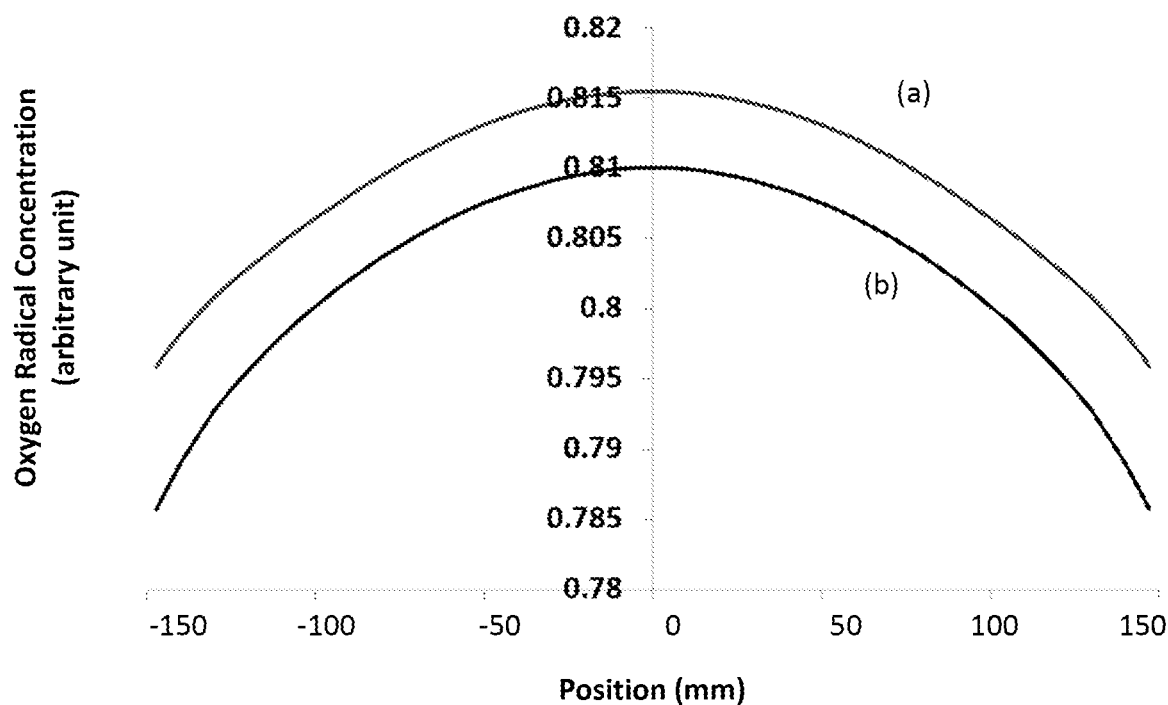
FIGS. 2A and 2B show numerical simulations of oxygen radical concentration over a substrate according to embodiments.
Figure 2B:
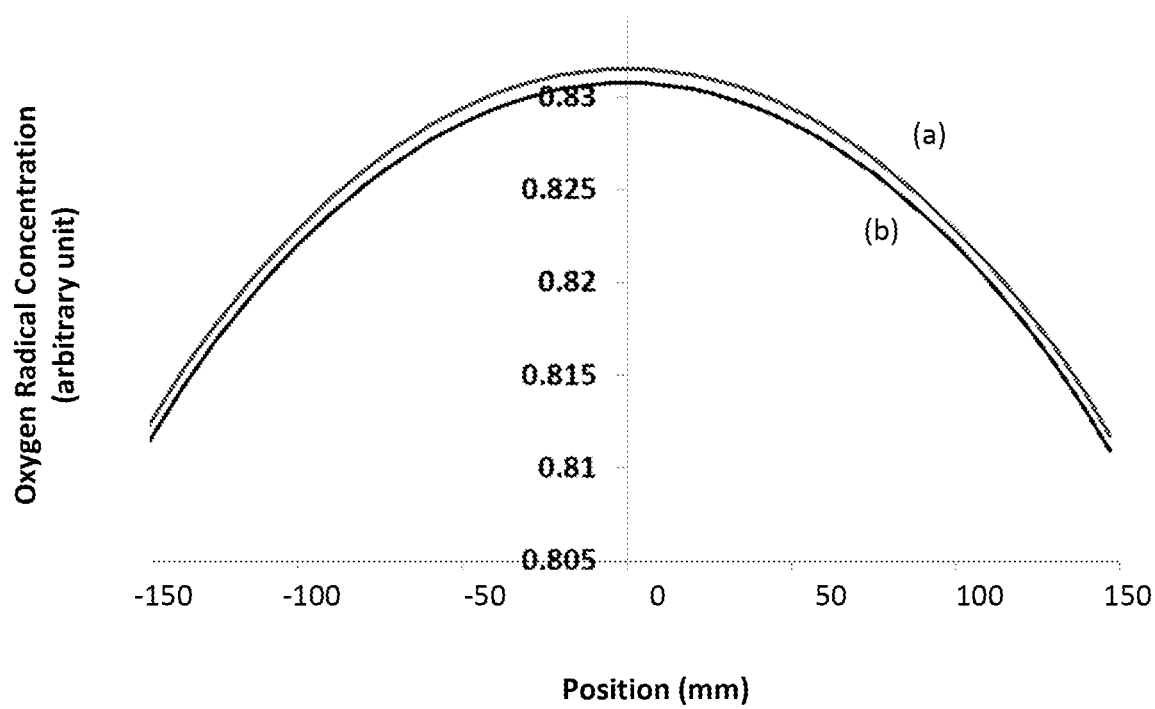

FIGS. 2A and 2B show numerical simulations of oxygen radical concentration over the substrate 101 with a 300 mm diameter as functions of a position along a line in the Y direction intersecting the center 308 of the substrate 101.

The position indicated as "0" corresponds to the center 308 of the substrate 101. In FIG. 2A, the side exhaust pump 300 is turned off, and the first and second main exhaust pumps 160, 136 are turned on. In FIG. 2B, the side exhaust pump 300 and the first main exhaust pump 160 are turned on. In FIGS. 2A and 2B, the cone angles θ are assumed to be 15° in the numerical simulations indicated by (a) and 25° in the numerical simulations indicated by (b). In FIG. 2A, the oxygen radical concentration is reduced at the center 308 of the substrate 101 (i.e., the position indicated as "0") for the cone angle θ of 15° and 25°, respectively, and spreads towards the edges of the substrate 101 (i.e., the positions indicated as "150" and "−150"). In FIG. 2B, the oxygen radical concentration is reduced at the center 308 of the substrate 101 (i.e., the position indicated as "0") for the cone angle θ of 15° and 25°, respectively, and spreads towards the edges of the substrates 101 (i.e., the positions indicated as "150" and "−150").

Figure 3A:
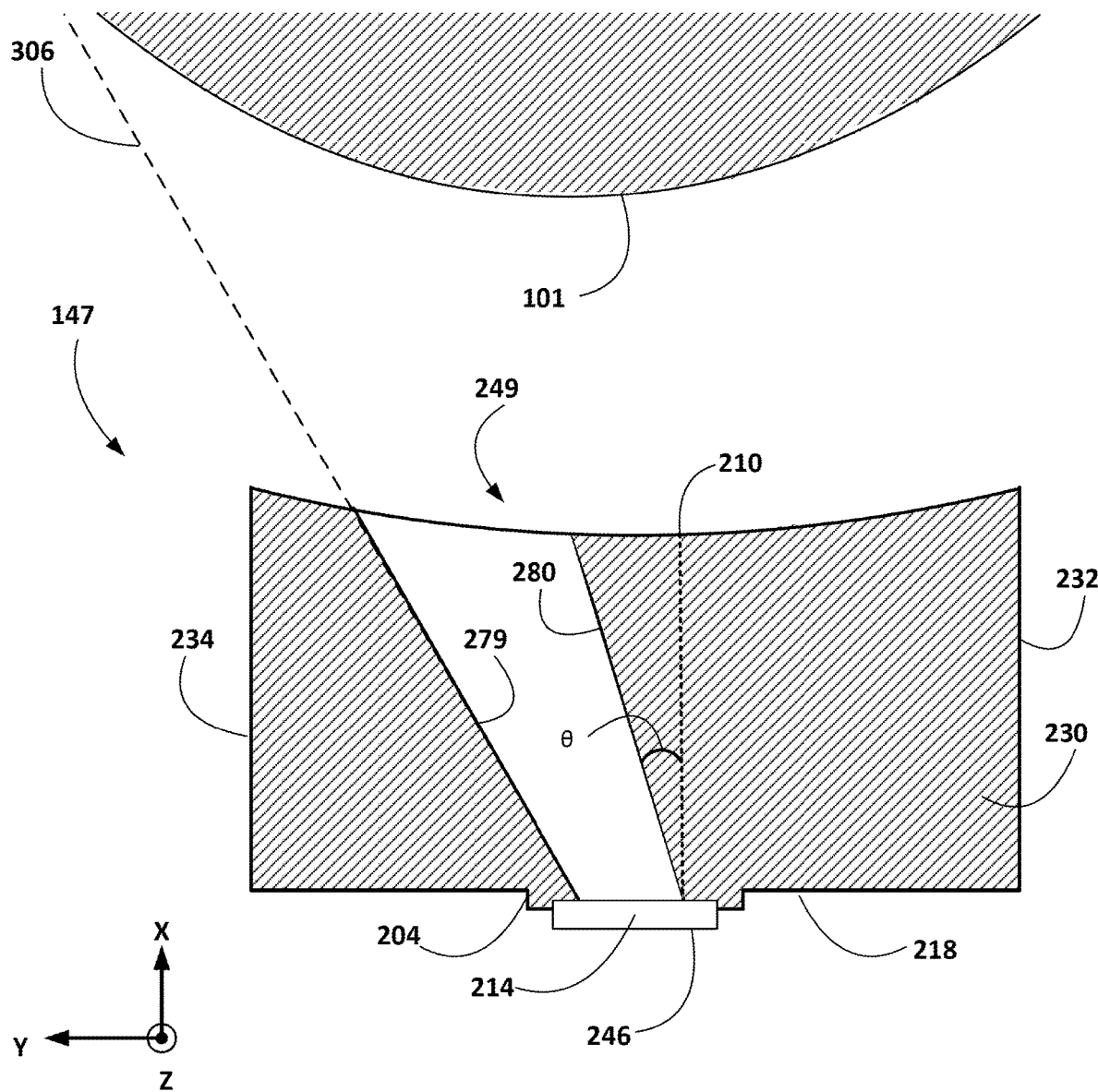
FIG. 3A is a schematic cross-sectional top view of a gas injector according to one embodiment.

FIG. 3A is a schematic cross-sectional top view of the gas injector 147 according to one embodiment. The gas injector 147 may be made of any suitable material such as quartz, ceramic, aluminum, stainless steel, steel, or the like.

The gas injector 147 has a body 230 in which a gas injection channel 249 and an opening 246 are formed. In some embodiments, the opening 246 is rectangular.

In some embodiments, the body 230 is parallelepiped. The body 230 has a first side 232 opposite a second side 234. In some embodiments, the first side 232 and the second side 234 are parallel to the X axis and have substantially the same length. The body 230 has a third side 224, a fourth side 222, a fifth side 226, and a sixth side 282, as shown in FIG. 3B.

The gas injection channel 249 may have any desired shape in cross-section, such as rectangular (shown in FIG. 3B), square, round, polygonal, hexagonal, trapezoidal, or any other suitable shape. The gas injector 147 is adapted to direct the majority of the main gas flow 145 to the second edge 302 of the processing volume 139. The gas injection channel 249 includes two interior surfaces 279, 280 (FIG. 3A). In some embodiments, the interior surface 279 extends along a direction 306 that is substantially tangential to the edge of the substrate supporting surface of the substrate support 138 near the second edge 302 of the processing volume 139. The interior surface 280 of the gas injection channel 249 is tilted from an axis line 210 by a cone angle θ towards the interior surface 279. The axis line 210 extends through the opening 246 and is parallel to the X direction and perpendicular to the fifth side 226 (shown in FIG. 3B). The interior surfaces 279, 280 are along directions that are tilted from the axis line 210 towards the second edge 302 and projections of these surfaces, which are all parallel to the X-Y plane, are configured to not intersect the center 308 of the substrate 101. The cone angle θ may be between 5° to 45°. Interior surfaces 279, 280 extend from the opening 246 to the sixth side 282 (shown in FIG. 3B). The sixth side 282 is curved and adjacent to the substrate 101 and on the opposite side of the opening 246.

Figure 3B:
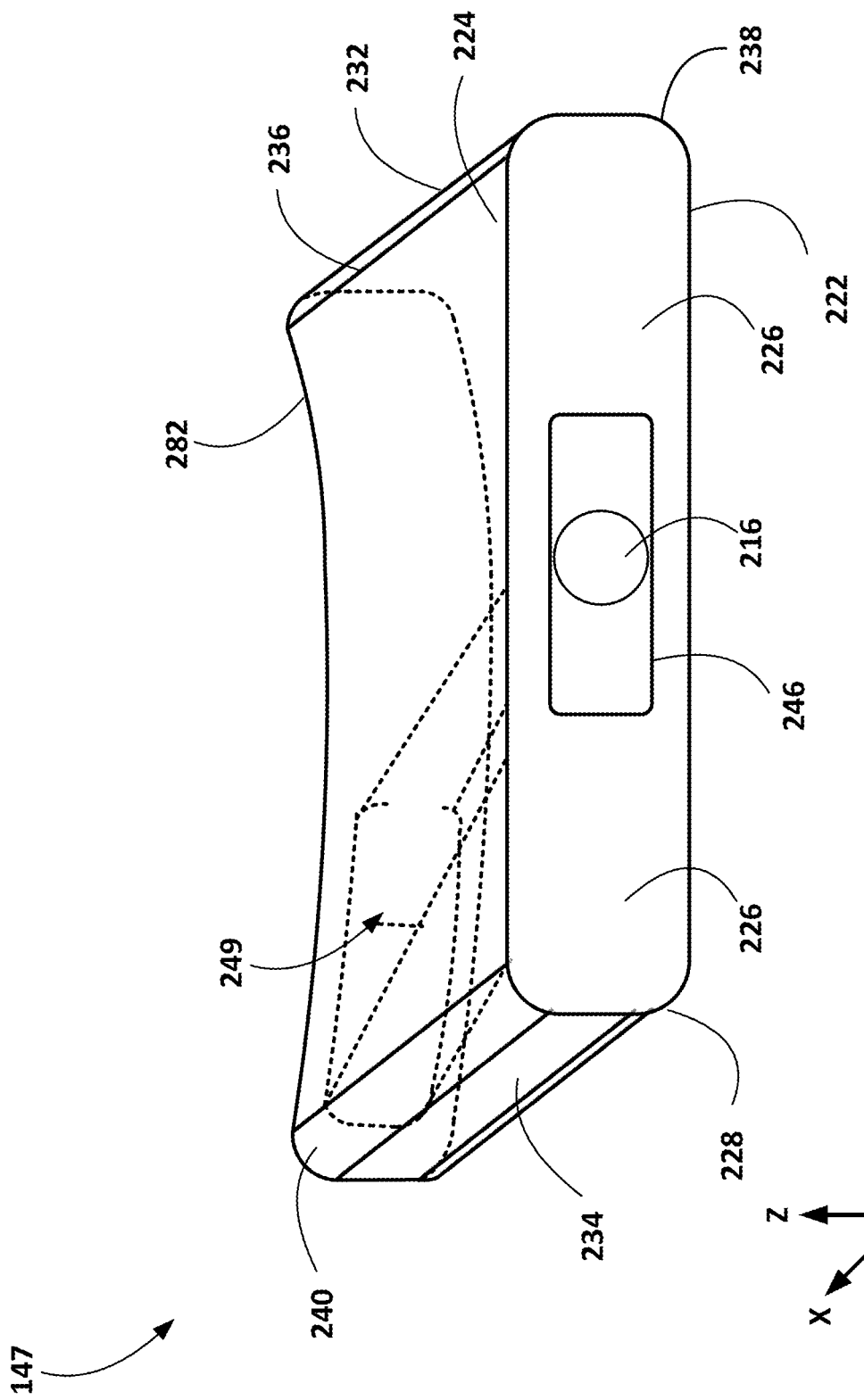
FIGS. 3B and 3C are three-dimensional schematic views of a gas injector according to one embodiment.

In some embodiments, the opening 246 has a circular inlet 216 (as shown in FIG. 3B). The circular inlet 216 leads to an expanded interior space 214 (FIG. 3A) that is in fluid communication with the gas injection channel 249. In some embodiments, the expanded interior space 214 has a rectangular cross-sectional shape in the Y-Z plane.

Figure 3C:
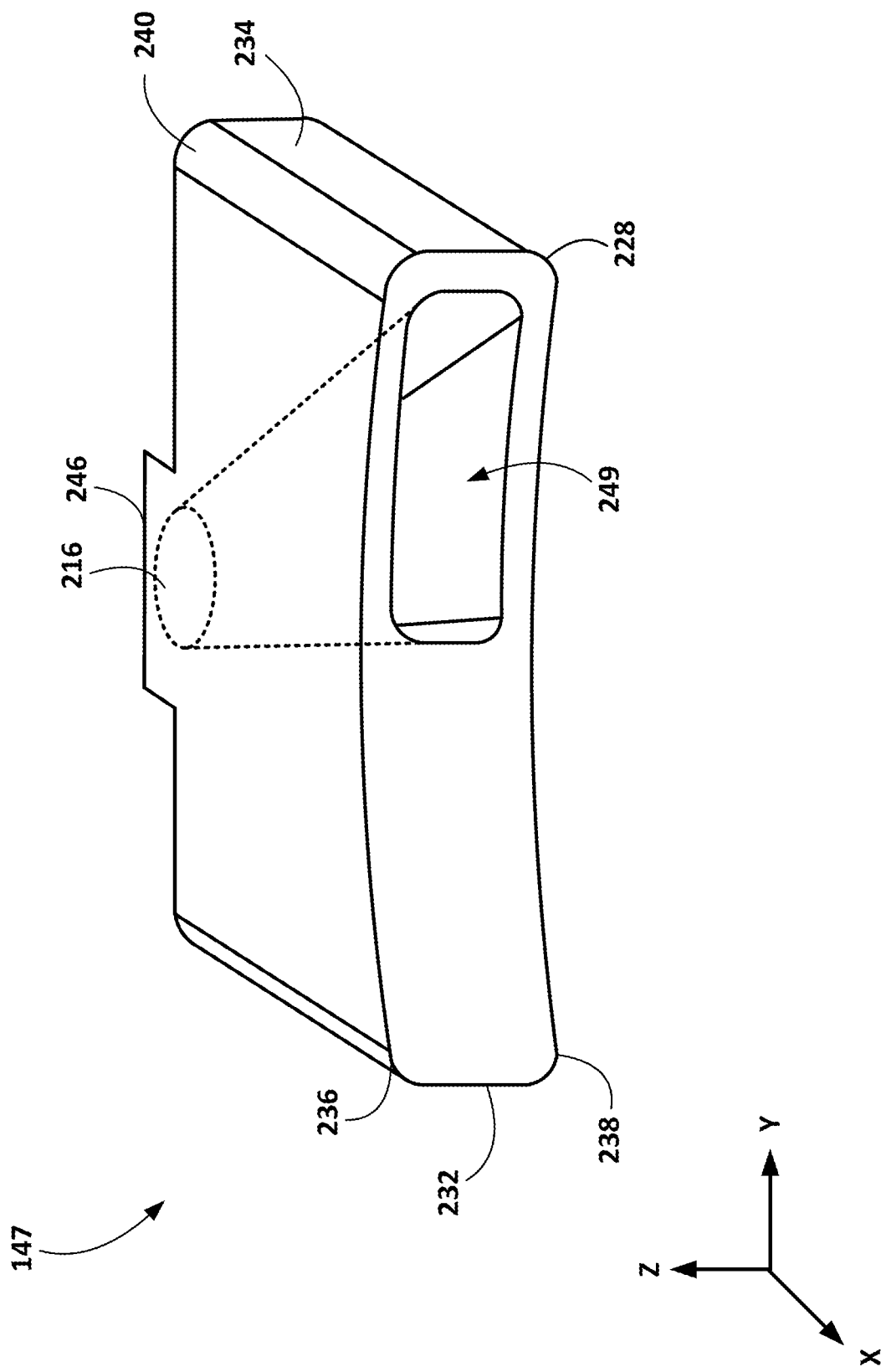

FIGS. 3B and 3C are three-dimensional schematic views of the gas injector 147. The gas injector 147 functions to direct majority of gas or gas of radicals found in the main gas flow 145 towards the second edge 302 of the processing volume 139.

The gas injector 147 includes sides 226, 232, 234, 282, 224, and 222. The first side 232 is opposite the second side 234. In some embodiments, the first side 232 and the second side 234 are parallel to the X axis and have substantially the same length. A first curved surface 236 is disposed between the first side 232 and the third side 224. The third side 224 is disposed orthogonally to the first side 232. A second curved surface 240 is disposed between the second side 234 and the third side 224. A third curved surface 238 is disposed between the first side 232 and a fourth side 222. The fourth side 222 is orthogonal to the first side 232. A fourth curved surface 228 is disposed between the second side 234 and the fourth side 222. The third side 224 is opposite the fourth side 222. A fifth side 226 is opposite a sixth side 282. In some embodiments, the sixth side 282 is curved. In one example, the radius of curvature of the sixth side 282 may be between about 160 mm to about 230 mm. In another example, the radius of curvature of the sixth side 282 may be between about 10 mm to about 80 mm larger than the radius of a substrate that is to be processed in the processing volume 139. The gas injection channel 249 is disposed on the sixth side 282 facing the substrate 101. The first side 232 and the second side 234 may be substantially perpendicular to the fourth side 222 allowing for a more cohesive seal within the processing chamber 100. When the sixth side 282 is curved such that the curvature contours the curvature of the substrate 101, turbulent gas flow is reduced in the gas flow towards the substrate 101, leading to uniformity in the gas flow.

Figure 4:
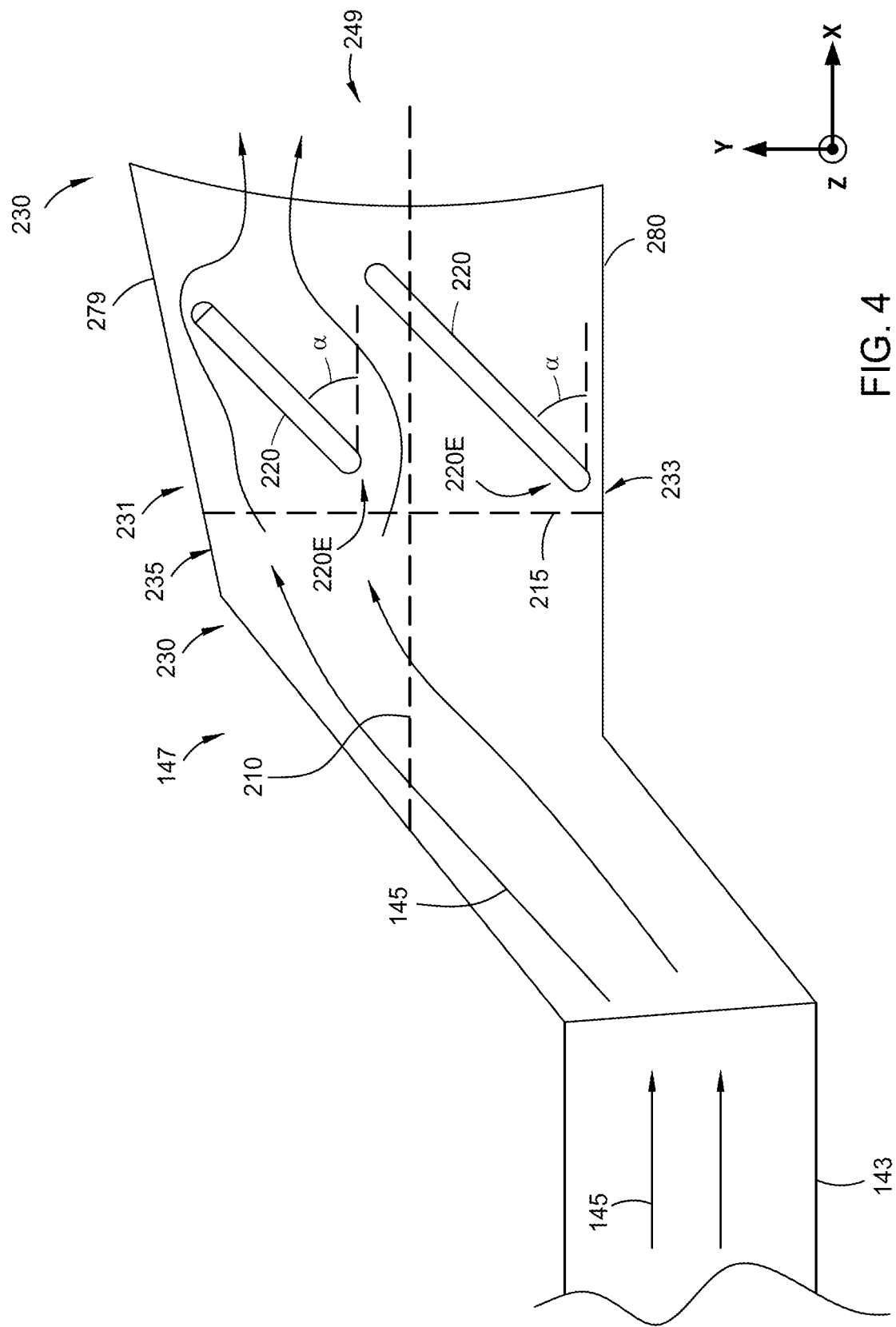
FIG. 4 is a schematic cross-sectional top view of a gas injector according to one embodiment.

FIG. 4 illustrates a schematic cross-sectional top view of the gas injector 147 according to another embodiment. As shown, the gas injector 147 includes a body 230, in which a gas injection channel 249 is formed. The gas injection channel 249 has two interior surfaces 279, 280, and a plurality of linear rudders 220. Although only two linear rudders 220 are shown in the embodiment illustrated in FIG. 4, it is to be understood that any number of linear rudders 220 can be included in the gas injector 147. The body 203 and the linear rudders 220 can be made of quartz or any other material unreactive to the reactant gas. The gas injector 147 is divided into a first portion 231 and a second portion 229 by a dividing line 215, wherein the dividing line 215 is parallel to the Y-direction. The plurality of linear rudders 220 are disposed in the first portion 231. The first portion 231 and second portion 229 can be two separate pieces that combine to make the gas injector 147, or the first portion 231 and the second portion 229 can be made of the same piece. The gas injector 147 is coupled to the inlet 143, and the inlet 143 delivers the reaction gas to the gas injector 147. The gas injector 147 is configured to deliver the reaction gas to the substrate 101.

The gas injector 147 is divided into a top portion 235 and a bottom portion 233 by the axis line 210, wherein the axis line 210 is parallel to the X-direction. The linear rudders 220 are disposed and angled in such a way that the reaction gas flows mostly or completely through the top portion 235 of the gas injector 147, according to one embodiment. If the reactant gas is allowed to flow through the bottom portion 233 of the gas injector 147, a large portion of the reaction gas misses the majority of the substrate area and remains unreacted or drawn into the side port 122 and then the side exhaust pump 300, wasting the reactant gas and resulting in uneven film growth on the portion of the substrate disposed over the right extent of the processing volume 139 (i.e., near the first edge 304). In addition, the gas injector 147 without rudders exhibit jet stream-like flow, where the main gas flow 145 is concentrated in one narrow stream. The gas injector 147 with rudders 220 disclosed herein allows for main gas flow 145 to spread in a much wider area, while still being focused on the left extent of the processing volume 139 (i.e., near the second edge 302).

The main gas flow 145 through the top portion 235 of the gas injector 147 allows for film growth mostly or entirely on the portion of the substrate 101 in the left extent of the processing volume 139 (i.e., near the second edge 302). In addition, the increased circulation of the reactant gas due to the linear rudders 220 increases the reaction rate of the reaction gas with the substrate 101, leading to faster film growth. The linear rudders 220 are disposed such that the integrated velocity of the reactant gas over the left extent of the processing volume 139 near the second edge 302 is as high as possible, while the integrated velocity still being as uniform as possible in the left extent the processing volume 139 near the second edge 302. The linear rudders 220 allow for a higher velocity of the main gas flow 145 than other rudder shapes, such as wedges.

The plurality of linear rudders 220 can be disposed in any arrangement within the first portion 231 of the gas injector 147. The plurality of linear rudders 220 have an angle α with respect to the axis line 210 towards the second edge 302 of the processing volume 139. Each of the linear rudders 220 can have the same angle α or a different angle, according to some embodiments. The angle α varies from about 5° to about 85°, such as from about 25° to about 55°, or from about 35° to about 45°, according to some embodiments. An end 220E of at least one of the plurality of linear rudders 220 is separated from the bottom surface 202 by a distance of about 15 mm to about 60 mm, according to one embodiment. An end 220E of at least one of the plurality of linear rudders 220 are separated from the dividing line 215 by a distance of about 35 mm to about 45 mm, according to one embodiment. The linear rudders in the plurality of linear rudders 220 have a length from about 25 mm to about 75 mm, according to one embodiment. The plurality of linear rudders 220 are disposed such that a main gas flow 145 of the reactant gas out of the gas injector 147 has a Reynolds number (Re) of about 100 or less, and the main gas flow 145 is laminar, according to one embodiment.

In some embodiments, during the delivery of the reactant gas to a surface of the substrate 101, the substrate 101 can be heated from a temperature of about 23° C. to about 1200° C. The reactant gas can be delivered such that the reactant gas grows film on the portion of the substrate 101 in the left extent of the processing volume 139 near the second edge 302. About 60% to about 90% or more of the volume of the film is disposed in the left extent of the processing volume 139 near the second edge 302.

Even though a thermal processing chamber is discussed in this application, implementations of the present disclosure may be used in any processing chamber where uniform gas flow is desired.

Benefits of the present disclosure include the use of an asymmetric gas injector in a processing chamber to direct gas towards the edge of the substrate to control growth uniformity throughout the substrate. The asymmetric gas injector points to a gas flow towards an edge of the processing volume. The gas flow can be further redirected to the other edge of the processing volume by a side pump. Particularly, it has been observed that directing gas through an asymmetric gas channel will significantly increase the reaction at or near the edge of the substrate in a RadOx® process, thereby leading to improved thickness uniformity along the edge of the substrate as well as an improved overall thickness uniformity of the substrate.

While the foregoing is directed to implementations of the present disclosure, other and further implementations of the disclosure may be devised without departing from the basic scope thereof, and the scope thereof is determined by the claims that follow.

What is claimed is:

1. A method for processing a substrate, comprising:
    injecting a gas flow in a first direction from a gas source into a gas injector when processing a substrate on a substrate support disposed within a processing volume of a processing chamber, the substrate support having a first edge and a second edge opposite the first edge in a direction orthogonal to the first direction, the processing chamber having a chamber gas inlet and a chamber gas outlet, the substrate support disposed between the chamber gas inlet and the chamber gas outlet in the first direction; and
    injecting the gas flow from the gas injector into the processing chamber, wherein:
        the gas flow from the gas injector is directed in a second direction and a third direction; and
        the second and third directions are misaligned with a center of a substrate disposed on the substrate support and are at an angle to the first direction towards the second edge of the substrate support.

2. The method of claim 1, further comprising:
    rotating the substrate support around the center of the substrate.

3. The method of claim 1, wherein:
    the second direction is tilted from the first direction by between 5° to 45° towards the second edge of the substrate support; and
    the third direction is substantially tangential to the second edge of the substrate support.

4. The method of claim 1, further comprising:
    exhausting the gas flow from the chamber gas outlet by a first main exhaust pump disposed on a first side of the processing chamber and a second main exhaust pump disposed on a second side of the processing chamber, the second side being opposite the first side in a fourth direction that is orthogonal to the first direction.

5. The method of claim 1, further comprising:
    exhausting the gas flow from the chamber gas outlet by a first main exhaust pump disposed on a first side of the processing chamber and from the processing volume by a side exhaust pump disposed on the first side of the processing chamber near the first edge of the substrate support.

6. A method for processing a substrate, comprising:
    injecting a gas flow in a first direction from a gas source into a gas injector when processing a substrate on a substrate support disposed within a processing volume of a processing chamber, the substrate support having a first edge and a second edge opposite the first edge in a direction orthogonal to the first direction, the processing chamber having a chamber gas inlet and a chamber gas outlet, the substrate support disposed between the chamber gas inlet and the chamber gas outlet in the first direction; and
    injecting the gas flow from the gas injector into the processing chamber, wherein:
        the gas flow from the gas injector is directed in a second direction and a third direction;
        the second and third directions are misaligned with a center of a substrate disposed on the substrate support and are at an angle to the first direction towards the second edge of the substrate support;

the first, second, and third directions are parallel to a first plane;

the second and third directions are misaligned with a center of the substrate, and are at an angle to the first direction towards the second edge of the substrate support; and the second and third directions are not the same.

7. The method of claim 6, further comprising:

rotating the substrate support around the center of the substrate.

8. The method of claim 6, wherein:

the second direction is tilted from the first direction by between 5° to 45° towards the second edge of the substrate support; and the third direction is substantially tangential to the second edge of the substrate support.

9. The method of claim 6, further comprising:

exhausting the gas flow from the chamber gas outlet by a first main exhaust pump disposed on a first side of the processing chamber and a second main exhaust pump disposed on a second side of the processing chamber, the second side being opposite the first side in a fourth direction that is orthogonal to the first direction.

10. The method of claim 6, further comprising:

exhausting the gas flow from the chamber gas outlet by a first main exhaust pump disposed on a first side of the processing chamber and from the processing volume by a side exhaust pump disposed on the first side of the processing chamber near the first edge of the substrate support.

\* \* \* \* \*